（12）United States Patent
Sarin et al.

(10) Patent No.: US 8,107,296 B2
(45) Date of Patent: Jan. 31, 2012

(54) MITIGATION OF DATA CORRUPTION FROM BACK PATTERN AND PROGRAM DISTURB IN A NON-VOLATILE MEMORY DEVICE

(75) Inventors: Vishal Sarin, Cupertino, CA (US); Jung-Sheng Hoei, Fremont, CA (US); Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/912,027

(22) Filed: Oct. 26, 2010

(65) Prior Publication Data

US 2011/0058413 A1 Mar. 10, 2011

Related U.S. Application Data

(63) Continuation of application No. 11/943,729, filed on Nov. 21, 2007, now Pat. No. 7,830,718.

(51) Int. Cl.
*G11C 16/04* (2006.01)

(52) U.S. Cl. ......... 365/185.18; 365/185.13; 365/185.14; 365/185.17

(58) Field of Classification Search ............. 365/185.18, 365/185.13, 185.14, 185.17
See application file for complete search history.

(56) References Cited

U.S. PATENT DOCUMENTS

| | | | |
|---|---|---|---|
| 6,970,382 B2 * | 11/2005 | Toros et al. | 365/185.22 |
| 7,085,167 B2 * | 8/2006 | Lee et al. | 365/185.22 |
| 7,327,609 B2 | 2/2008 | Kim et al. | |
| 7,554,847 B2 | 6/2009 | Lee | |
| 7,558,122 B2 * | 7/2009 | Kim et al. | 365/185.33 |
| 7,830,718 B2 * | 11/2010 | Sarin et al. | 365/185.18 |
| 2006/0062049 A1 | 3/2006 | Lee et al. | |
| 2006/0126391 A1 | 6/2006 | Kim et al. | |
| 2008/0310224 A1 | 12/2008 | Roohparvar et al. | |
| 2009/0129146 A1 | 5/2009 | Sarin et al. | |

* cited by examiner

*Primary Examiner* — Pho M Luu
(74) *Attorney, Agent, or Firm* — Leffert Jay & Polglaze, P.A.

(57) ABSTRACT

In one of the disclosed embodiments, a write algorithm is used to remove errors due to back pattern effects, cell-to-cell capacitive coupling, and program disturb in memory cells. Original data to be programmed is adjusted prior to an initial programming operation of the memory cells. The original data is then programmed into the memory cells in another programming operation. In an alternate embodiment, a read adjustment weight data value is associated with each series string of memory cells. The weight data value is used to compensate data read during an initial word line read. The weight data value is updated after each read and read adjustment such that the adjusted weight data value is used on the subsequent read operations.

20 Claims, 6 Drawing Sheets

MITIGATION OF DATA CORRUPTION FROM BACK PATTERN AND PROGRAM DISTURB IN A NON-VOLATILE MEMORY DEVICE

RELATED APPLICATION

This application is a Continuation of U.S. application Ser. No. 11/943,729, titled "MITIGATION OF DATA CORRUPTION FROM BACK PATTERN AND PROGRAM DISTURB IN A NON-VOLATILE MEMORY DEVICE" filed Nov. 21, 2007, now U.S. Pat. No. 7,830,718, issued Nov. 9, 2010 that is commonly assigned and incorporated by herein reference.

TECHNICAL FIELD

The present disclosure relates generally to semiconductor memory and more particularly to non-volatile memory devices.

BACKGROUND

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

FIG. 1 illustrates a schematic diagram of a portion of a typical prior art NAND architecture memory array comprising series strings of non-volatile memory cells. The array is comprised of an array of non-volatile memory cells 101 (e.g., floating gate) arranged in series strings 104, 105 that are referred to as columns. Each of the cells 101 are coupled drain to source in each series string 104, 105. A select line, such as word lines WL0-WL31, that spans across multiple series strings 104, 105 is coupled to the control gates of each memory cell to form what is conventionally referred to as a row in order to control their operation in response to biasing of the bit lines. Transfer lines, such as the bit lines BL1, BL2 are coupled to sense amplifiers (not shown) that detect the state of each cell by sensing current on a particular bit line.

The word lines WL0-WL31 select the individual memory cells in the series strings 104, 105 to be written to or read from and operate the remaining memory cells in each series string 104, 105 in a pass through mode. Each series string 104, 105 of memory cells is coupled to a source line 106 by a source select gate 116, 117 and to an individual bit line BL1, BL2 by a drain select gate 112, 113. The source select gates 116, 117 are controlled by a source select gate control line SG(S) 118 coupled to their control gates. The drain select gates 112, 113 are controlled by a drain select gate control line SG(D) 114.

Each memory cell can be programmed as a single level cell (SLC) or multilevel cell (MLC). Each cell's threshold voltage ($V_t$) is indicative of the data that is stored in the cell. For example, in an SLC, a $V_t$ of 0.5V might indicate a programmed cell while a $V_t$ of −0.5V might indicate an erased cell. The MLC may have multiple $V_t$ windows (i.e., a range of $V_t$ voltages) that each indicate a different state. Multilevel cells take advantage of the analog nature of a traditional flash cell by assigning a bit pattern to a specific voltage range stored on the cell. This technology permits the storage of two or more bits per cell, depending on the quantity of voltage ranges assigned to the cell.

The resistance of a series string of memory cells varies in response to the programmed pattern of the memory cells above a target cell in the series string. A change in resistance causes the bit line discharge rate to change, resulting in the appearance of a higher threshold voltage for a read cell.

FIG. 2 illustrates a schematic diagram of an equivalent circuit representing one of the NAND memory cell strings in accordance with FIG. 1. The equivalent circuit is comprised of the bit line 201 that is coupled to the memory cell series string equivalent 200. The string equivalent 200 is comprised of a select gate drain transistor 204 that couples the string to the bit line 201. A select gate source transistor 205 couples the string 200 to the source line 202. A target memory cell 209 is the memory cell of the string that is selected to be programmed or read. In the illustrated embodiment, the target transistor 209 is at the bottom of the string 200 closest to the source line 202.

A resistance 207 represents the sum, $R_S$, of all of the resistances of the memory cells in the NAND string 200 between the target memory cell 209 and the select gate drain transistor 204 (i.e., above the selected cell). The capacitance 208 represents the total capacitance of the memory cells of the NAND string 200 above the target memory cell 209.

In a typical prior art sensing operation, the series string of memory cells is initially precharged from the bit line 201 to which it is coupled. An attempt is then made to discharge the series string current through the target cell to be read/verified. If the target cell is erased, the string discharges. If the cell is programmed, the string does not discharge. This scheme is used to determine the programmed state of a target cell.

When writing to the target cell 209, all of the memory cells in the string above it are normally erased since programming of a memory string typically begins at the bottom cell. In this case, $R_S$ is small resulting in a higher bit line current during the verify operation.

In a worst case scenario, all of the cells in the string 200 above the target cell 209 are then programmed, thus increasing $R_S$. With an increased $R_S$, the bit line current decreases and a read operation of the target cell 209 might appear to have a threshold voltage that is outside of the programmed state. In any case, the increase of the resistance of the series string of memory cells when programmed will add a certain level of millivolts that opens the $V_t$ distribution window and makes it appear that the read cell has a higher threshold voltage than what was programmed. Since the series resistance varies due to the different, unknown states of the cells above the selected cell, the amount of change in $V_t$ cannot be predicted.

For the reasons stated above, and for other reasons which will become apparent to those skilled in the art upon reading and understanding the present specification, there is a need in the art for compensation of this back pattern effect in a memory device.

DETAILED DESCRIPTION

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

The following described embodiments for compensating for back pattern effect are described as applied to a NAND architecture non-volatile memory device. However, the present embodiments are not limited to any one type of memory architecture or memory technology.

Figure 1:
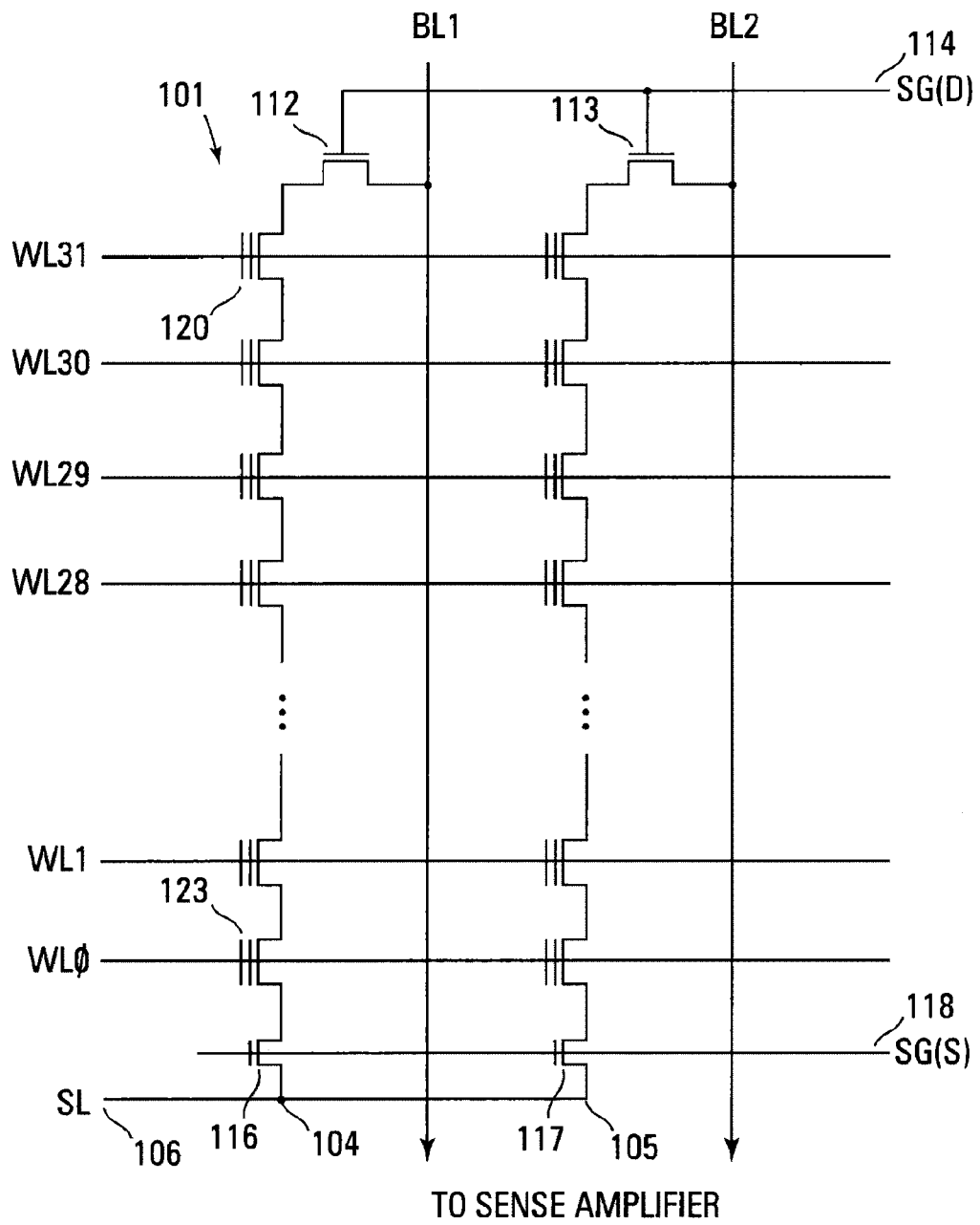
FIG. 1 shows a typical prior art series string of memory cells of a memory array organized in a NAND architecture.
Figure 2:
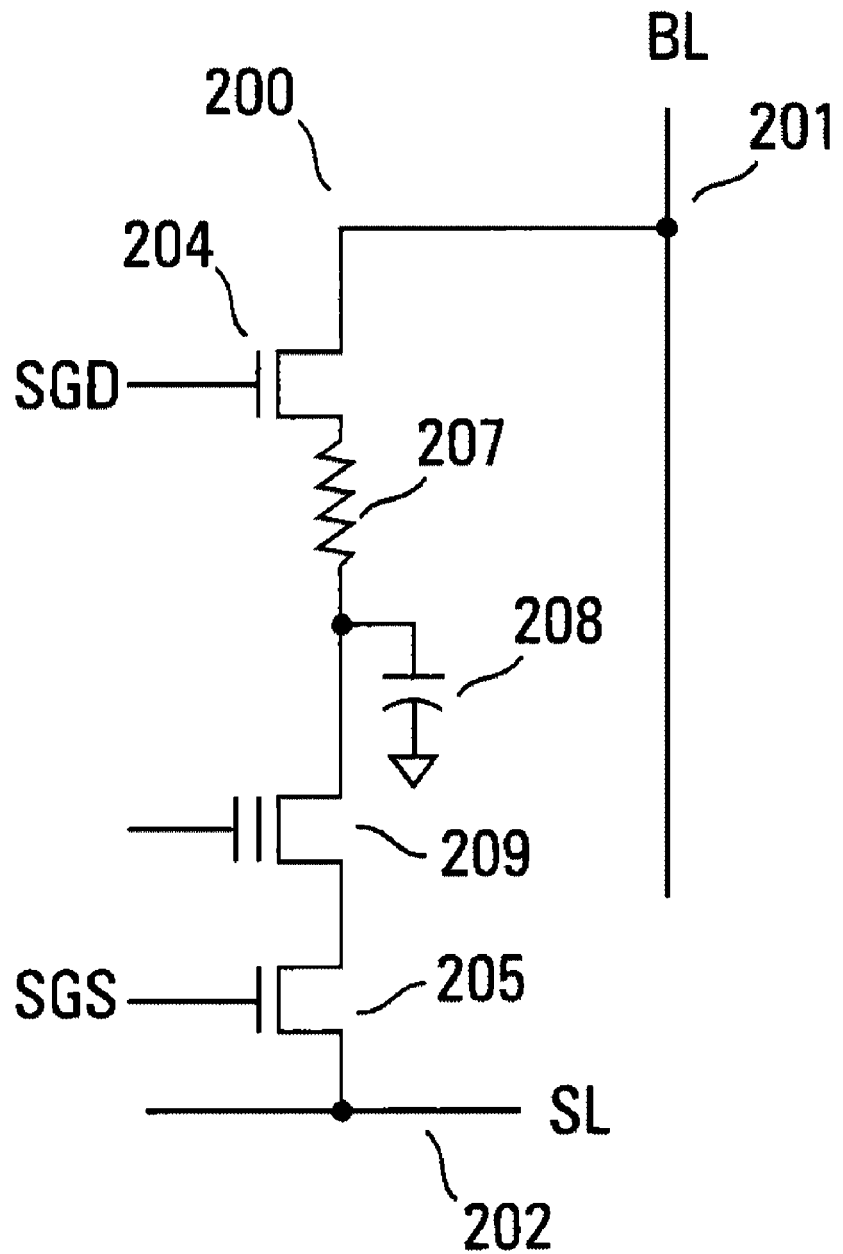
FIG. 2 shows a schematic diagram of one embodiment of a prior art representation of the NAND series string of FIG. 1.
Figure 3:
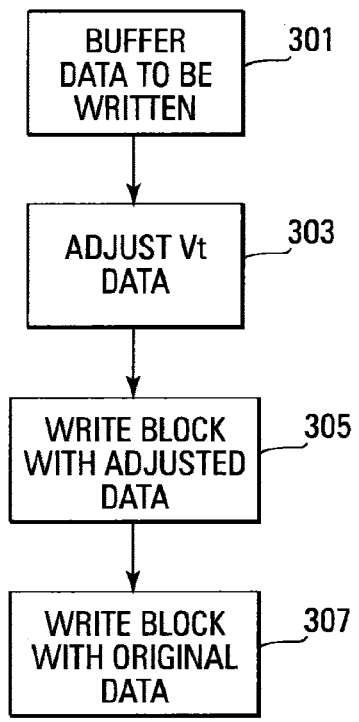
FIG. 3 shows a flowchart of one embodiment of a method for compensating for back pattern effect over a write channel.

FIG. 3 illustrates a flowchart of one embodiment of a write channel method for removing errors due to back pattern effect in a memory array. The algorithm also mitigates errors due to floating gate coupling between neighboring cells in the memory array. The write channel is the path used to program the memory block.

While the method of FIG. 3 refers to programming a block of memory (e.g., 32 word lines), the disclosed method is not limited to any one size of memory array. For example, an entire memory block can be erase/programmed, less than a memory block can be erased/programmed, or multiple memory blocks can be erased/programmed.

As with all programming of non-volatile memory cells, it is assumed that the memory block is initially erased. In one embodiment, the data to be programmed into the block is buffered 301 prior to programming. The data to be programmed can be in either an analog or a digital format.

The analog data is an analog voltage representative of the actual threshold voltage to be programmed into the memory cell. The analog voltage representation of the analog data can be a conditioned or level shifted analog voltage. The analog voltage is programmed into the memory cell by a high voltage (e.g., 16V) programming pulse that moves the memory cell's threshold distribution from the negative, erased state to the desired analog voltage. A program verification is typically performed between each programming pulse to determine the current state of the cell.

The digital data is a digital bit pattern that is representative of a programmed state of the memory cell. For example, a "011" might represent a programmed threshold voltage of 2.55V. The digital data can be programmed by writing the representative bit pattern to the memory device where a digital-to-analog converter can be used to convert the bit pattern to an analog voltage for programming of the memory cell.

The data to be programmed is adjusted by a fixed amount 303. In an analog embodiment, the adjustment decreases the threshold voltage that is indicative of the data to be programmed. In a digital embodiment, the adjustment decreases the digital bit pattern that is indicative of the data to be programmed.

The fixed amount is determined by characterizing the memory device in order to determine the amount of back pattern and capacitive coupling disturb effects experienced by memory cells in response to various voltage swings on adjacent cells. The characterization can be performed during the manufacturing/testing process where the integrated circuit can be initially erased to a negative state and then random memory cells programmed to different positive threshold voltages. The amount of change in the threshold voltages on adjacent memory cells is then noted to determine the effect from each different positive threshold voltage. An indication of this effect is then used as the fixed amount used to adjust the data to be programmed.

In an alternate embodiment, instead of using a fixed $V_t$ adjustment, the $V_t$ data is adjusted by an amount that decreases for each word line as the distance between the selected word line increases from the source line. This is due to the fact that the back pattern effect decreases as the distance from the source line increases.

The adjustment 303 to the data to be programmed can be performed on the buffered data either after it is stored in the buffer or prior to the data being stored in the buffer. In an alternate embodiment, the adjustment can be done while the data is being read out of the buffer for programming into the memory block. In either case, the adjusted memory block of data is written to the memory cells 305.

The programming of the memory cells with the adjusted data, in one embodiment, is accomplished using coarse programming pulses. Coarse programming reduces the time for programming by using a large incremental increase in programming voltage over the previous programming pulse. For example, the programming operation may start with a programming pulse of 16.0V. After the program verify operation determines that the memory cell is not programmed to the target threshold voltage, the next programming pulse might be incremented by 1.0V for coarse programming instead of a normal programming pulse increment of 0.5V. A fine programming pulse increment might be 0.25V.

After the adjusted data is written to the memory block 305, the original target data is then written to the memory block 307. This programming can be done in a fine programming mode in order to achieve tighter $V_t$ distributions.

Figure 7:
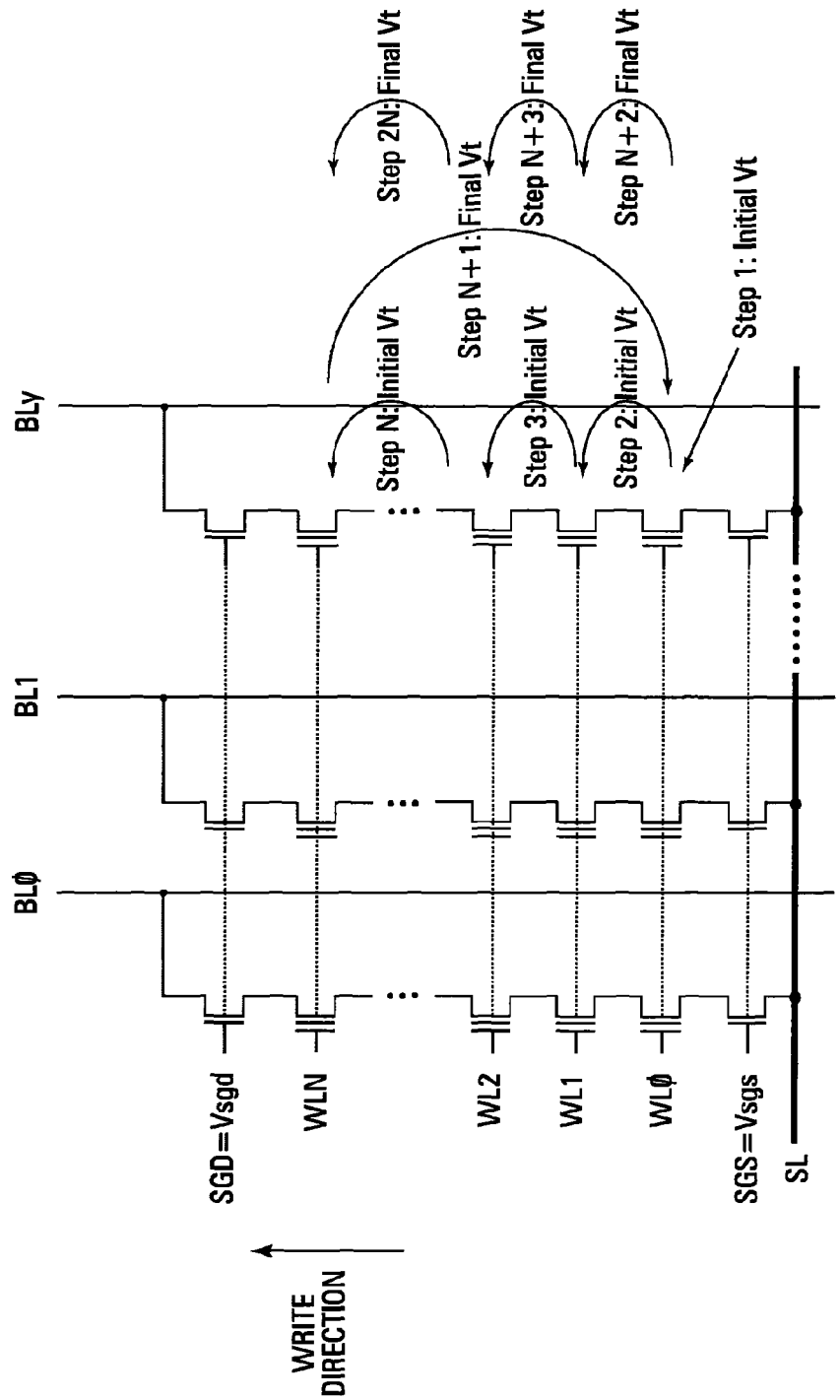
FIG. 7 shows a schematic diagram of one embodiment of a portion of a memory block in accordance with the method of FIG. 3.

FIG. 7 illustrates a schematic of one embodiment of a partial memory block in accordance with the write channel method of FIG. 3. This figure shows word lines WL0-WLN and bit lines BL0-BLY. The writing of the cells of the memory block, in the illustrated embodiment, start at WL0 that is typically the closest to the source line SL.

Programming begins with step 1 writing the initial threshold voltages to the cells being programmed on word line WL0. Step 2 writes the initial threshold voltages of the cells being programmed on WL1, Step 3 writes the initial threshold voltages of the cells being programmed on WL2. This continues until Step N writes the initial threshold voltages of the cells being programmed on WLN.

The method continues with Step N+1 writing the final threshold voltages to the cells being programmed on WL0. Step N+2 writes the final threshold voltages to the cells being programmed on WL1. Step N+3 writes the final Vt to the cells being programmed on WL2. This continues until Step 2N writes the final threshold voltages to the cells being programmed on WLN.

Even though the above-described programming of the memory block is discussed in terms of analog programming, the concept can also be applied to the equivalent digital bit patterns that are representative of data to be stored. For example, the bit patterns can be adjusted digitally, by a digital adjustment factor, prior to the adjusted digital data being programmed into the memory block.

Figure 4:
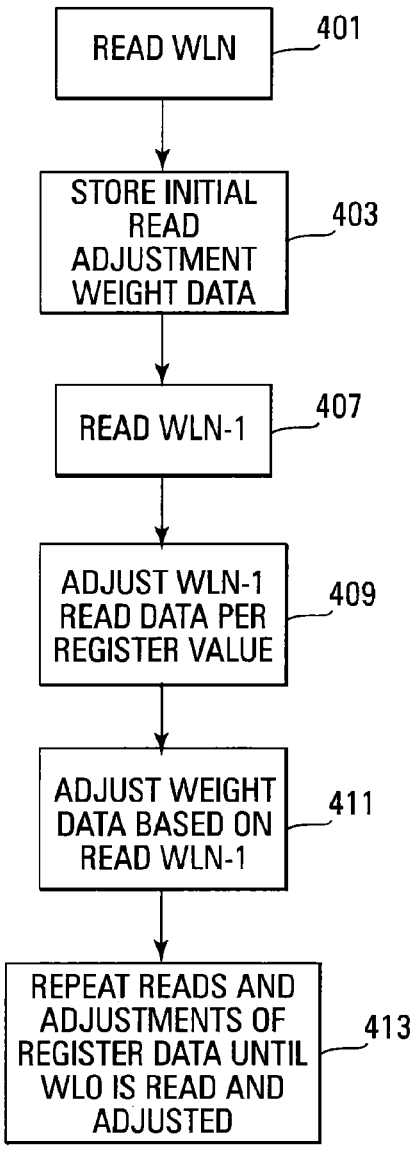
FIG. 4 shows a flowchart of an alternate embodiment for compensating for back pattern effect.

FIG. 4 illustrates a flowchart of an alternate embodiment of a method for compensating for back pattern effect in a memory device. This embodiment performs the adjustment over a read channel. The read channel of a memory device is the path over which data is read from a memory block.

In this embodiment, data is programmed into the memory cells of the memory block using a typical prior art programming technique that does not take into account the back pattern effect. When the data is read, however, the read data is adjusted with "weight data" that takes into account the back pattern effect on the data as it was being programmed.

Figure 5:
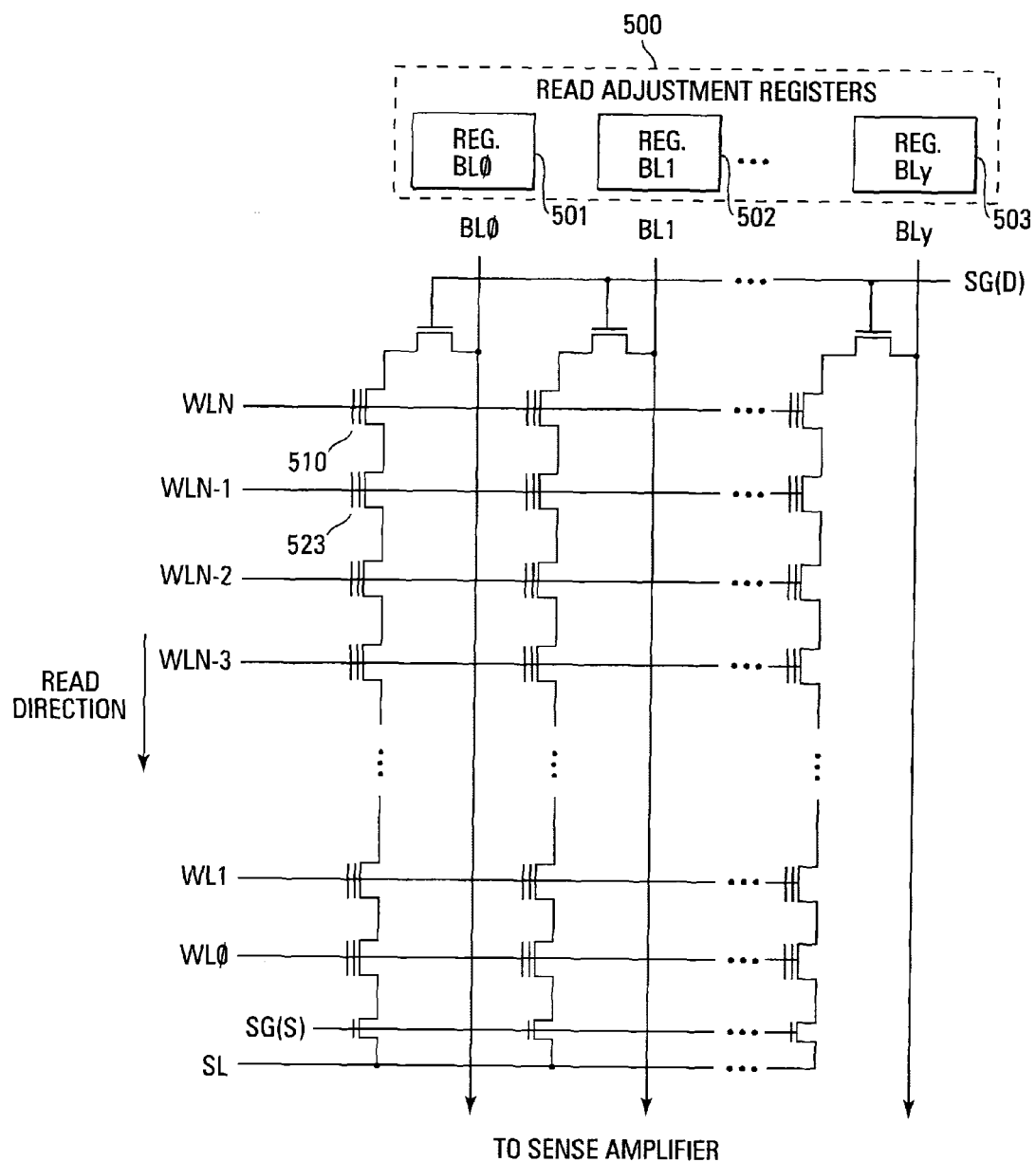
FIG. 5 shows a schematic diagram of one embodiment of a portion of a memory block in accordance with the method of FIG. 4.

The read adjustment weight data value is an adjustment factor that is generated after an initial read of the word line WLN furthest from the source line, as illustrated in the schematic of FIG. 5. This is assuming that the programming was done on the word line closest to the source first. The read would be done in an opposite direction of the programming. Initial weight data is generated for the first column of memory cells by reading 401 the top-most memory cell 510 for BL0 and determining its present threshold voltage. The higher the threshold voltage for the memory cell 510, the greater the back pattern effect experienced by the remaining memory cells of the series string and, thus, the higher the initial weight data.

For example, for a programmed threshold value of 3.0V, the weight data might be 3%. A programmed threshold value of 2.0V might have a weight data assigned of 2.5%. These weight data are percent change (e.g., decrease) of the read data from the column of memory cells to which they apply. These numbers are for purposes of illustration only as the actual values will be different for different memory technologies and for different integrated circuits of the same memory technology.

Referring to FIG. 5, a set of read adjustment registers 500 is used to store the weight data. A different register 501-503 within this set of registers 500 is assigned to a different series string of memory cells. For example, the BL0 register 501 is assigned to store the weight data for the BL0 string of memory cells.

Referring again to the flowchart of FIG. 4, after the initial read 401 of the memory cells on the top-most word line WLN, the initial read adjustment weight data is stored 403 in its respective register 501-503. The memory cells that are coupled to word line WLN do not typically require adjustment for read operations since they do not experience the back pattern effect.

The memory cells on the next word line WLN–1 are then read 407. The data from each read memory cell on this word line is then adjusted 409 with the weight data that is stored in the respective register for that particular bit line.

As one example of operation, assume register BL0 501 contains a 3% weight data value and the memory cell 523 coupled to WLN–1 on the first bit line BL0 is read and is determined to have a threshold voltage of 2.55V. To compensate the read operation for the back pattern effect, the read threshold voltage of 2.55V is reduced by the 3% weight data (i.e., 2.55–0.08=2.47V) to determine the actual read value from the memory cell 523.

The stored weight data value in each register 501-503 is then adjusted again 411 based on the read threshold voltages of memory cells of the WLN–1 word line. As in the initial generation of the weight data, the greater the threshold voltage stored in a particular memory cell, the greater the adjustment to the weight data stored in the respective register 501-503.

In continuing the above example of operation assuming the initial 3% weight data that is stored in register BL0 501, the memory cell on word line WLN–1 is read and determined to have a threshold value of 1.50V. This could necessitate an adjustment of the stored weight data value by another 1.0%. Thus, the weight data value for that particular bit line register 501-503 is updated to 4.0%. This updating is performed for each respective register 501-503 in the set of read adjustment registers 500 in response to the reading of the respective memory cell on the WLN–1 word line.

The above-described process of read operations, adjustments to the read data, and adjustments to the weight data value for each series string is repeated 413 through the reading of the memory cells on the WL0 word line. Since the memory cells on the WL0 word line are closest to the source line, they will be affected the most by the back pattern effect. Therefore, the weight data value is going to be greatest for the memory cells on the last word line to be read.

While the embodiment of FIG. 4 is described as starting at the top-most word line WLN of FIG. 5, alternate embodiments can start at other word lines further down the series string. For example, one embodiment might start reading at word line WLN–3.

In yet another embodiment, the read adjustment registers 500 of FIG. 5 can be replaced with a look-up table. Such a table might store the bit line number (i.e., BL0) along with the associated weight data value and/or the weight data value adjustment required for each word line.

The above-described read adjustment weight data values and the adjustments to the weight data values based on read threshold voltages can be determined through empirical testing of each particular memory device during the manufacturing process. For example, the affects of each programmed threshold voltage on the back pattern effect for each series string and the necessary initial weight data as well as the subsequent adjustments to this initial weight data can be determined at manufacture and stored in the memory device. The present embodiments are not limited to any one set of weight data values or adjustments to these values.

FIGS. 5 and 7 show a write direction being from word line closest to the source line and progressing upward towards and the read direction being from the top of the series string down towards the source line. However, this is for purposes of illustration only since the reading and writing directions depend on the embodiment. It is preferred that the reading be in an opposite direction from the writing.

Figure 6:
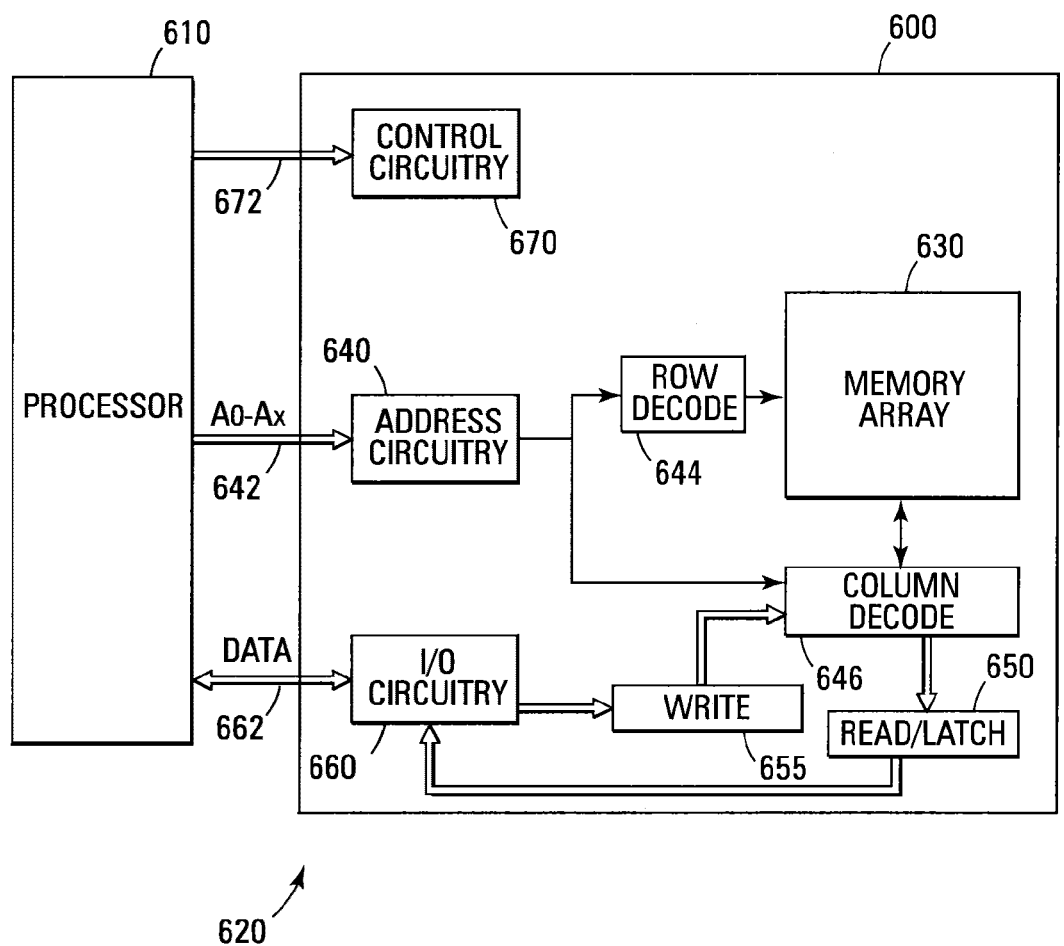
FIG. 6 shows a block diagram of one embodiment of a memory system that incorporates the back pattern compensation of the present disclosure.

FIG. 6 illustrates a functional block diagram of a memory device 600 that can incorporate the non-volatile memory cells of the present embodiments. The memory device 600 is coupled to a processor 610. The processor 610 may be a microprocessor or some other type of controlling circuitry. The memory device 600 and the processor 610 form part of a memory system 620. The memory device 600 has been simplified to focus on features of the memory that are helpful in understanding the present embodiments.

The memory device includes an array of flash memory cells 630 or some other type of non-volatile memory cells.

The memory array 630 is arranged in banks of rows and columns. The control gates of each row of memory cells is coupled with a word line while the drain and source connections of the memory cells are coupled to bit lines. As is well known in the art, the connection of the cells to the bit lines depends on whether the array is a NAND architecture, a NOR architecture, an AND architecture, or some other array architecture.

An address buffer circuit 640 is provided to latch address signals provided on address input connections A0-Ax 642. Address signals are received and decoded by a row decoder 644 and a column decoder 646 to access the memory array 630. It will be appreciated by those skilled in the art, with the benefit of the present description, that the number of address input connections depends on the density and architecture of the memory array 630. That is, the number of addresses increases with both increased memory cell counts and increased bank and block counts.

The memory device 600 reads data in the memory array 630 by sensing voltage or current changes in the memory array columns using sense amplifier/buffer circuitry 650. The sense amplifier/buffer circuitry, in one embodiment, is coupled to read and latch a row of data from the memory array 630. Data input and output buffer circuitry 660 is included for bi directional data communication over a plurality of data connections 662 with the processor 610. Write circuitry 655 is provided to write data to the memory array.

Control circuitry 670 decodes signals provided on control connections 672 from the processor 610. These signals are used to control the operations on the memory array 630, including data read, data write, and erase operations. The control circuitry 670 may be a state machine, a sequencer, or some other type of controller. The control circuitry 670 is adapted to execute the embodiments of the back pattern and program disturb (such as from floating gate coupling) mitigation method.

The non-volatile memory device illustrated in FIG. 6 has been simplified to facilitate a basic understanding of the features of the memory and is for purposes of illustration only. A more detailed understanding of internal circuitry and functions of non-volatile memories are known to those skilled in the art.

CONCLUSION

One or more embodiments of the present disclosure provide mitigation of data corruption due to back pattern effect and program disturb in a non-volatile memory device, such as a NAND flash memory. One embodiment operates over the write channel to remove back pattern effect errors and floating gate to floating gate coupling effect errors as it is being programmed. An alternate embodiment operates over the read channel, compensating the data being read that is already affected by the back pattern effect.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method for generating back pattern effect compensation in a memory device, the method comprising:
   reading data from memory cells having their control gates commonly coupled;
   adjusting the read data from each of the commonly coupled memory cells in response to read adjustment weight data assigned to each series string of memory cells; and
   adjusting each read adjustment weight data after adjusting each read data.

2. The method of claim 1 and further including storing an initial read adjustment weight data in a different register for each respective series string of memory cells.

3. The method of claim 2 wherein adjusting each read adjustment weight data comprises adding an adjustment to a previous read adjustment weight data based on read data from a selected one of the memory cells.

4. The method of claim 3 wherein the adjustment is determined by characterizing the memory device to determine an amount of back pattern and program disturb effect experienced by memory cells in response to voltage swings on adjacent memory cells.

5. The method of claim 3 wherein the adjustment is a fixed amount that is determined by characterizing the memory device in order to determine an amount of capacitive coupling disturb effects experienced by memory cells in response to various voltage swings on adjacent memory cells.

6. The method of claim 5 wherein the characterizing comprises:
   erasing the memory device to a negative state; and
   programming random memory cells to different positive threshold voltages.

7. The method of claim 6 wherein the threshold voltages are adjusted by an amount that decreases for each word line as a distance between a selected word line increases from a source line.

8. The method of claim 1 wherein the adjustment to the read adjustment weight data is an increase of the read adjustment weight data.

9. The method of claim 1 wherein the read adjustment weight data is read from a look-up table.

10. The method of claim 9 wherein the look-up table comprises a bit line number that is associated with associated weight data and/or adjustment weight data for each word line.

11. A memory device comprising:
   an array of memory cells; and
   a set of read adjustment registers, each register associated with a different series string of the memory cells and adapted to store a read adjustment weight data for its respective one of the series strings wherein the read adjustment weight is used to adjust data read from at least one of the memory cells coupled to the respective one of the series strings.

12. The memory device of claim 11 and further including a control circuitry configured to adjust the read adjustment weight data in each register.

13. The memory device of claim 12 wherein the control circuit is further adapted to generate initial read adjustment weight data in response to an initial read operation of a memory block.

14. A method for mitigating errors in a memory device, the method comprising:
   buffering a signal comprising original bit patterns to be programmed into a set of memory cells, each bit pattern representative of a threshold voltage;
   adjusting the signal such that the threshold voltages are reduced to create adjusted data;

programming the adjusted data to the set of memory cells; and programming the original data to the set of memory cells.

15. The method of claim 14 wherein adjusting the bit patterns is performed prior to buffering the signal.

16. The method of claim 14 wherein programming the adjusted data is comprised biasing word lines coupled to the set of memory cells with coarse programming pulses.

17. The method of claim 16 wherein programming the original data comprises biasing the word lines with fine programming pulses having amplitude increases less than coarse programming amplitude increases.

18. The method of claim 17 wherein the coarse programming pulses increase the threshold voltages by a larger voltage than the fine programming pulses.

19. The method of claim 14 wherein the signal is a digital signal.

20. The method of claim 14 wherein the set of memory cells is a memory block.

* * * * *